United States Patent [19]
Cygan et al.

[11] Patent Number: 5,564,087
[45] Date of Patent: Oct. 8, 1996

[54] METHOD AND APPARATUS FOR A LINEAR TRANSMITTER

[75] Inventors: Lawrence F. Cygan, Schaumburg; Paul H. Gailus, Prospect Heights; William J. Turney, Schaumburg, all of Ill.

[73] Assignee: Motorola, Inc., Schaumburg, Ill.

[21] Appl. No.: 333,693

[22] Filed: Nov. 3, 1994

[51] Int. Cl.⁶ ............................ H01Q 11/12; H04B 1/04
[52] U.S. Cl. ........................ 455/126; 455/115; 455/116
[58] Field of Search .................................. 455/126, 115, 455/119, 127, 341, 116, 293, 67.1; 330/107, 129, 149

[56] References Cited

U.S. PATENT DOCUMENTS

| | | | |
|---|---|---|---|
| 4,630,315 | 12/1986 | Watkinson | 455/109 |
| 4,933,986 | 6/1990 | Leitch | 455/119 |
| 5,021,753 | 6/1991 | Chapman | 332/103 |
| 5,066,922 | 11/1991 | Leitch | 455/126 |
| 5,066,923 | 11/1991 | Gailus et al. | 330/107 |
| 5,121,077 | 6/1992 | McGann | 455/126 |
| 5,175,879 | 12/1992 | Ellingson et al. | 455/126 |
| 5,302,913 | 4/1994 | Hori | 330/129 |
| 5,423,082 | 6/1995 | Cygan et al. | 330/129 |
| 5,469,105 | 11/1995 | Sparks | 330/129 |

*Primary Examiner*—Reinhard J. Eisenzopf
*Assistant Examiner*—Gertrude Arthur
*Attorney, Agent, or Firm*—Andrew S. Fuller

[57] ABSTRACT

A method and apparatus is provided for a transmitter (200) with a stable, linear response. The transmitter (200) includes an amplification stage (242), and a negative feedback correction loop (244) with a feedback signal (252). A reference signal (251) is combined with the feedback signal (252) to produce an error signal (253) for coupling to the amplification stage (242). Transmitter parameters are varied when a difference between the reference signal (251) and the error signal (253) exceeds a particular threshold.

26 Claims, 8 Drawing Sheets

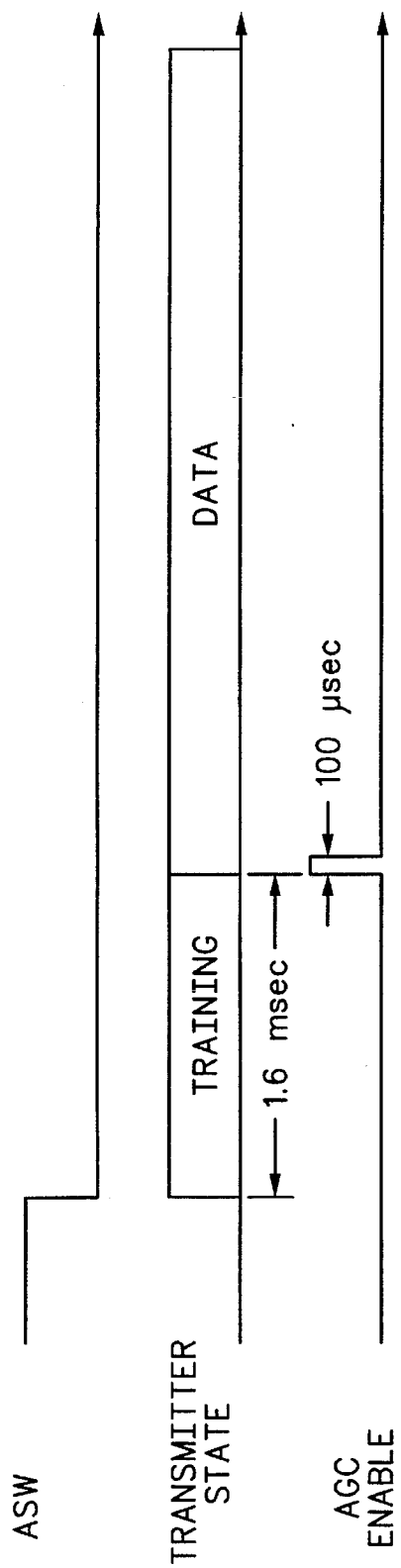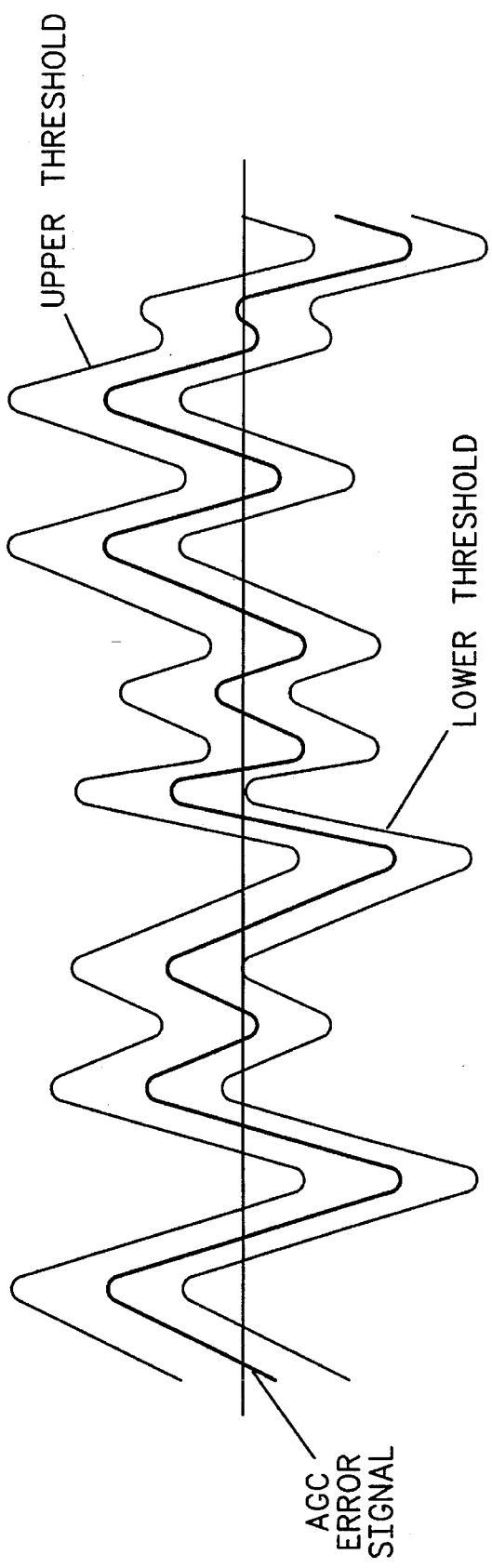

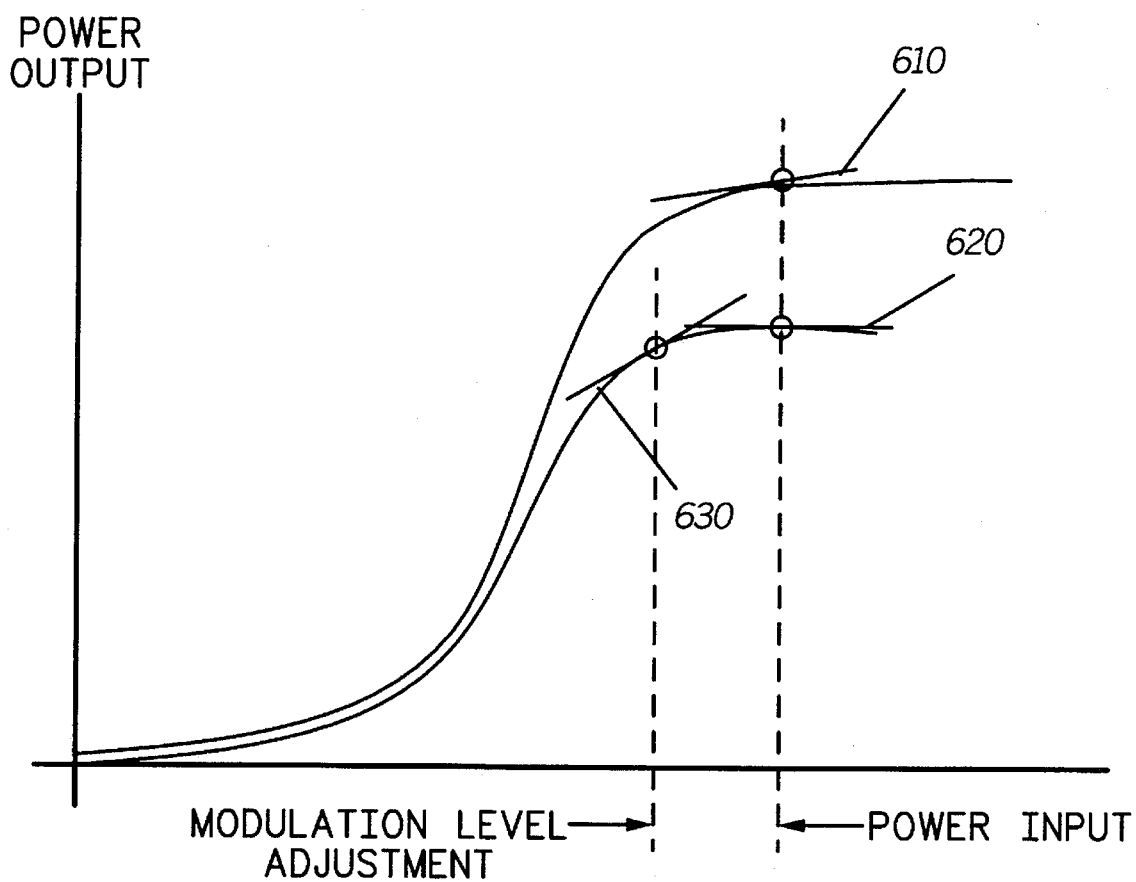

5,564,087

METHOD AND APPARATUS FOR A LINEAR TRANSMITTER

TECHNICAL FIELD

This invention relates in general to transmitters, and more particularly, to linear transmitters.

BACKGROUND OF THE INVENTION

In a typical radio communication device, a transmitter is coupled to an antenna to provide a transmission path for communication signals. The transmitter includes a power amplifier to amplify the signals before transmission. The behavior of a transmitter may be affected by its operating environment. For example, a transmitter operating near an electromagnetically reflective structure may be susceptible to energy reflected back through the antenna into the transmitter. Reflective energy may be detrimental to transmitter performance, particularly to the performance of the power amplifier. The power amplifier design often relies upon a constant load impedance in maximizing gain, efficiency, power output level, and other like parameters. To protect against changes in load impedance as a result of reflected energy, an isolator is often inserted between the antenna and the power amplifier of a transmitter in order to protect the power amplifier from reflected energy. The isolator directs the reflected energy to an absorptive load termination. Although the isolator generally works well, the isolator adds significant cost, size, and weight to the design of a radio communication device.

Another prior art solution to the problem of reflected energy incorporates a directional coupler to detect the reflected energy and adjusting the gain of the power amplifier accordingly. Generally, to minimize the potential of damage to the power amplifier, the gain to the power amplifier is reduced when high levels of reflected energy are present. Directional couplers and associated circuitry also add cost and complexity to a radio design.

FIG. 1 is a block diagram showing a prior art linear transmitter 100. Linear transmitters, which are typically used in quadrature amplitude modulation (QAM), must provide a predictable response in order to reliably transmit complex base band signals. In the linear transmitter 100, a signal source 110 provides a complex baseband signal to transmitter circuitry 120. Amplification circuitry 122 amplifies the signal for transmission through an antenna 130. As is typical in the prior art, a feedback signal from a negative feedback correction loop 124 is combined with the source signal in a summer 121. The feedback loop is used to improve the linearity of the power amplifier. In so doing, the level of energy transmitted on adjacent channel frequencies, known as splatter, is reduced. Such adjacent channel energy may be disruptive to negative feedback correction. Further included in the prior art transmitter 100 is an isolator 126 situated between the antenna 130 and the remaining transmitter circuitry.

The isolator presents a constant load impedance to the power amplifier irrespective of the impedance presented to the isolator by the antenna. The use of the isolator thereby avoids unpredictable variations in power amplifier gain and phase characteristics which would occur if the antenna were connected directly to the power amplifier. Those skilled in the art will understand that a varying load impedance will cause the power amplifier gain to change, thus altering the effectiveness of the feedback correction loop. Such load variations may also result in phase changes within the power amplifier which may make the feedback loop unstable. Unstable operation may result in severe interference to other communication services and/or the destruction of the linear transmitter. Thus, the isolator protects the power amplifier from load impedance changes and associated reflected energy from the antenna 130 during the transmission.

It is desirable to provide a linear transmitter while avoiding the cost, size, and weight issues associated with isolators. Such linear transmitters must be capable of rapidly adjusting to changes in operating environment to maintain a stable, linear response.

BRIEF DESCRIPTION OF THE DRAWINGS

FIG. 4 is a timing diagram showing the activation of an automatic gain control system for the purpose of scaling an error signal, in accordance with the present invention.

FIG. 5 is a graph depicting the threshold envelope for the scaled error signal, in accordance with the present invention.

FIG. 6 is a graph depicting power amplifier transfer characteristics under different antenna loads, in accordance with the present invention.

DETAILED DESCRIPTION OF THE PREFERRED EMBODIMENT

Figure 1:
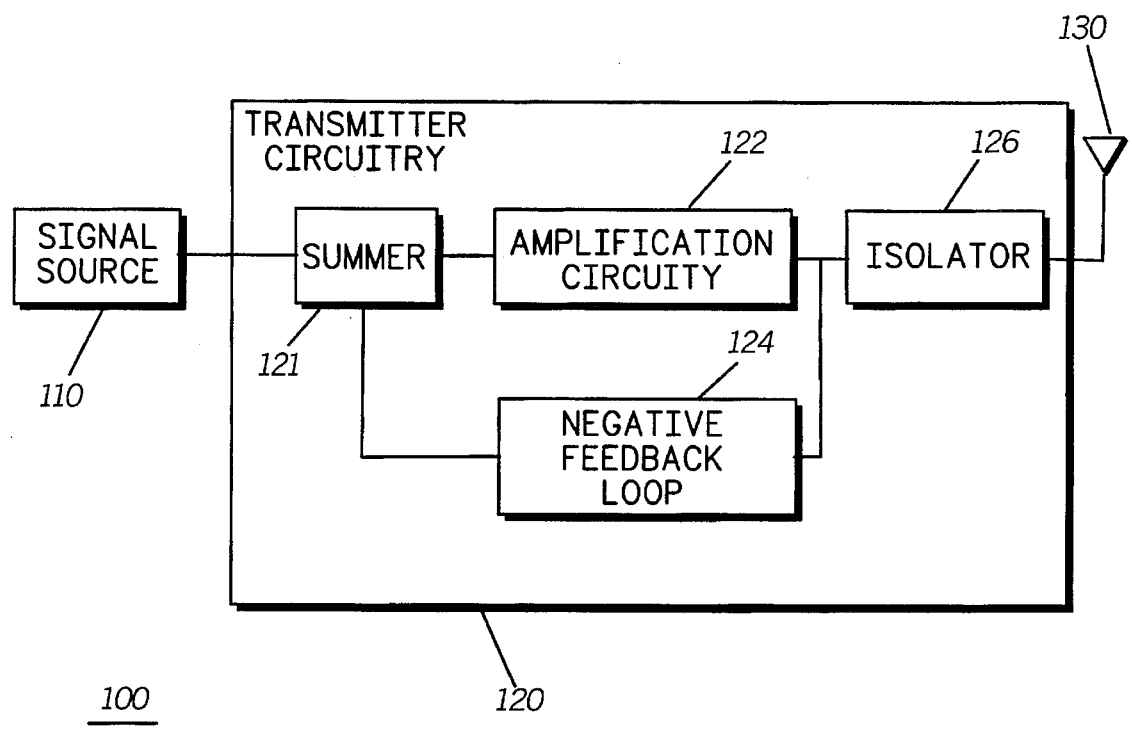
FIG. 1 is a block diagram showing a prior art linear amplifier.

While the specification concludes with claims defining the features of the invention that are regarded as novel, it is believed that the invention will be better understood from a consideration of the following description in conjunction with the drawing figures, in which like reference numerals are carried forward.

Figure 2:
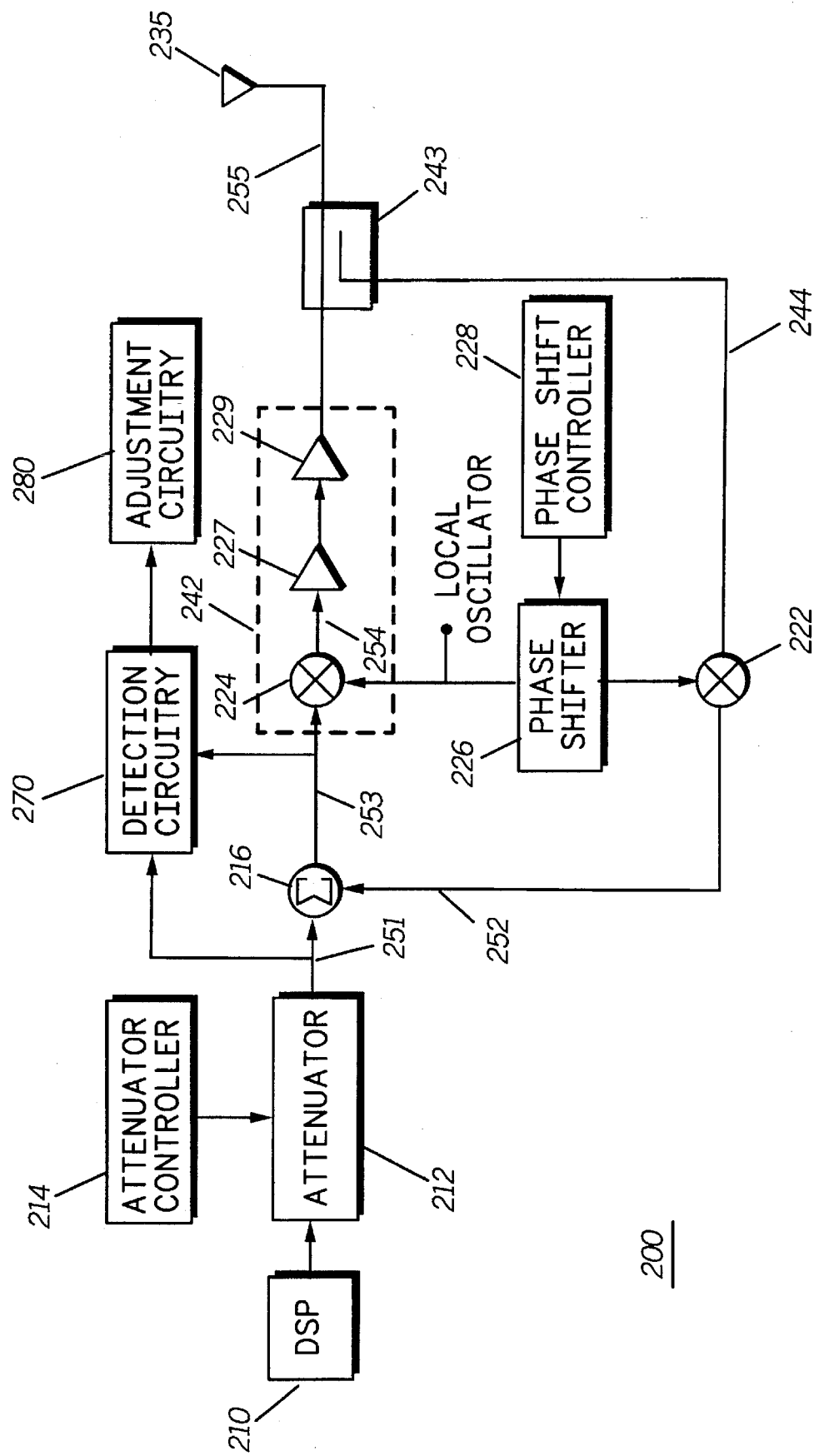
FIG. 2 is a linear transmitter in accordance with the present invention.

Referring now to FIG. 2, a linear transmitter 200 is shown in accordance with the present invention. A digital signal processor (DSP) 210 represents a signal source which provides an input signal to a variable attenuator 212. The input signal is a complex digital baseband signal having quadrature components, i.e., in-phase and quadrature signal components. The attenuator 212 provides a modulated reference signal 251 which is coupled to a summing junction 216. The summing junction 216 sums or combines a feedback signal 252 and the reference signal 251 to provide an error signal 253 as input to an amplification stage or circuitry 242. The amplification stage includes an up converter or mixer 224 to translate the modulated baseband signal to the required radio frequency (RF) for transmission as determined by the frequency of a local oscillator. A gain stage 227 amplifies the frequency translated signal and provides an input to a RF power amplifier 229 which in turn provides an RF output signal 255. In a negative feedback correction loop 244, the RF output signal is sampled by a directional coupler 243 and applied to a down converter or mixer 222, thereby returning the radio frequency signal to the baseband frequency. The output of the mixer 222 is the feedback signal 252. The RF output signal 255 is fed to the antenna 235.

A phase shifter 226, under the control of a phase shift controller 228, is used to set the loop phase such that the feedback signal 252 is effectively subtracted from the reference signal 251 in the summing junction 216. Feedback loop phase is adjusted by controlling the phase of the local oscillator applied to the down converter 222. An attenuator controller 214 controls the level of the modulated reference signals applied to the transmitter circuitry. In a preferred embodiment, attenuation adjustments and phase shift adjustments are provided in conjunction with a training waveform. A detailed description of the training waveform methodology can be found in U.S. Pat. No. 5,066,923, issued to Gailus et al. on Nov. 19, 1991, for a Linear Transmitter Training Method And Apparatus. No further discussion will be presented except to facilitate the understanding of the present invention. The training waveform is normally transmitted at the beginning of a transmission, but may also be transmitted during transmission depending upon the communication protocol. The training waveform provides a test signal for circuitry which adjusts modulation levels and loop phase. Proper attenuator adjustment avoids power amplifier clipping, which is responsible for adjacent channel interference (splatter). Proper loop phase adjustment is necessary to prevent loop instability.

In comparing the linear transmitter 200 of the present invention with those of the prior art, it is significant to note the absence of an isolator between the antenna 235, and the remainder of the transmitter circuitry. The removal of the isolator exposes the amplification circuitry to the full range of impedances which may be present at the antenna 235. In ordinary transmitter usage, these impedances may depart significantly from the impedances represented by the antenna's nominal free space design values. When reflective or absorptive bodies are positioned in close proximity to the antenna, the impedance present at the antenna varies in a complex manner. As amplifier designs are typically premised upon a relatively constant load impedance, when this constant load impedance cannot be guaranteed, appropriate compensation must be made in the transmitter circuitry.

The present invention includes the use of circuitry to detect and compensate for changes in the operating environment of the transmitter in order to maintain linear, stable operation. In the preferred embodiment, detection circuitry 270 and adjustment circuitry 280 are included to detect changes within the transmitter circuitry resulting from changes to its operating environment, and to initiate one or more corrective actions as needed. Corrective actions include adjustments to the attenuation and/or phase of the signals within the transmitter circuitry, i.e., the varying of transmitter parameters. The detection circuitry 270 determines, from the reference signal and the error signal whether, there are sufficient differences between the reference and error signals to warrant adjustments to the circuitry. When the differences are determined to exceed a particular threshold, the adjustment circuitry 280 initiates transmitter parameter adjustments, such as by varying the feedback loop gain or feedback loop phase or other signal within the amplification stage. Alternatively, the training waveform and associated transmitter circuitry adjustments may be exercised. Generally, the attenuator controller 214 and phase shift controller 228 operate to ultimately adjust the gain and phase, respectively, of the feedback loop.

Figure 3:
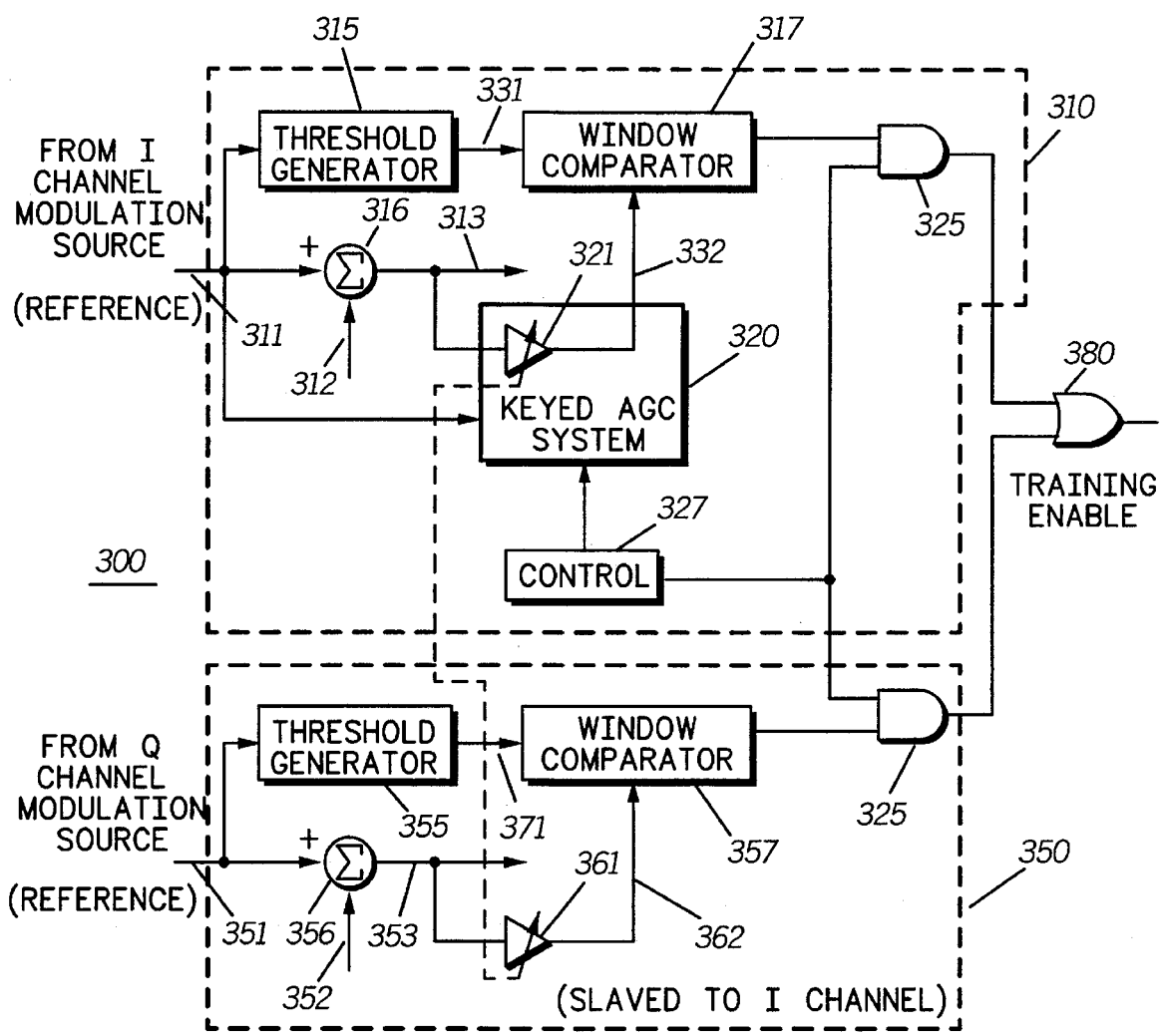
FIG. 3 shows circuitry for implementing detection of changes within the linear transmitter of FIG. 2, and adjustments thereof, in accordance with the present invention.

FIG. 3 is a more detailed view of one embodiment of the detection circuitry 270 and the adjustment circuitry 280 of FIG. 2, in accordance with the present invention. In this embodiment, the detection and adjustment circuitry operate in conjunction with the use of a training waveform to set transmitter parameters. Separate circuitry portions 310, 350 process the in-phase and quadrature signal components, respectfully, of the complex baseband reference signal from the attenuator or other signal source. Within the in-phase signal component circuitry 310, a summing junction 316 is coupled to the in-phase signal component 311 of the reference signal (see reference signal 251 of FIG. 2). The summing junction 316 combines the reference in-phase signal component 311 and a corresponding feedback signal 312 to provide an error in-phase signal component 313. The reference signal 311 is coupled to a threshold generator 315 which generates a signal threshold 331. Preferably, the signal threshold 331 has two components, an upper threshold and a lower threshold, which vary from the reference signal by a constant. The threshold generator 315 adds and subtracts a constant offset from the in-phase component of the reference signal to create continuous, variable trip points which form upper and lower threshold boundaries, respectively, for the reference signal. The reference signal 311 is also used as input to set the automatic gain control (AGC) system 320, which is used to scale the error signal 313 for comparison purposes. The AGC system 320 uses a variable amplifier 321 to scale the error signal 313 in order to provide a scaled error signal 332 which corresponds with the reference signal 311 when the linear transmitter is operating in a known, and preferred or optimum state. In the optimum state, the AGC system 320 operates to scale the error signal to correspond directly with the reference signal, such that there is no modulation level differences between the reference signal and the error signal. Generally, the transmitter is placed in a preferred state immediately after training, i.e., when the transmission of the training waveform and associated transmitter circuitry have been completed.

Referring to FIG. 4, a timing diagram depicting the enabling of the AGC system is shown in accordance with the present invention. The AGC system is activated shortly after a training operation is completed within the linear transmitter. For example, the antenna switch line (ASW) goes low, initiating transmission of the training waveform. During the training interval, the training waveform is used to measure and adjust the loop phase. This operation insures the feedback polarity around the loop is negative, producing a subtractive effect at the summing junction. Also, during the training interval, the clip point of the power amplifier is measured and used to determine the attenuation level to be applied to the modulated reference signal. In the preferred embodiment, the training operation takes approximately 1.6 milliseconds. Upon completion of the training operation, the AGC system is activated for a short (typically 100 microseconds window) time period. During the AGC activation window, the AGC monitors the reference signal 311 while adjusting the variable gain amplifier 321 which varies the gain of the error signal to produce the scaled error signal 332. At the conclusion of the AGC window, the gain control voltage applied to the variable gain stage of the amplifier is fixed using a sample and hold technique to maintain the scaled error signal 332. FIG. 5 shows a graph depicting upper and lower threshold signal values generated by the threshold generator 315, and the scaled error signal shortly after the completion of both training and AGC system operations.

In the event of an antenna load change, the power amplifier clip point, insertion phase, or both, will likely cause the error signal to cross either the upper, lower or both of the thresholds. As an example of a clip point change, FIG. 6 shows a graph of the input versus output characteristic of a power amplifier, and the effect of a load impedance variation on the characteristic. The gain associated with a nominal load is defined by a finite non-zero slope 610. If the modulation level is held constant during the load change, the slope is reduced relative to the nominal load case to that of slope 620. The reduced slope 620 implies a gain reduction. Since the overall feedback loop gain is comprised in part by the power amplifier's contribution, the antenna load change results in a loop gain reduction. The loop gain reduction is realized as an increase in the magnitude of the error signal, which causes the error signal to cross the threshold envelope from the threshold generator. Thus, when the error signal strays outside the threshold envelope, it is an indication that adjustments may be needed within the transmitter. Consequently, the transmitter can be compensated by adjustments to the modulation level and phase of the signals therein to re-establish the power amplifier clip point to that reflected by slope 630.

Referring back to FIG. 3, the scaled error signal 332 is compared against upper and lower boundaries or threshold values represented by the threshold signal 331. The window comparator 317 determines whether to cause an adjustment to the operating characteristics of portions of the transmitter. Generally, an adjustment to the transmitter circuitry occurs by enabling transmission of the training waveform, and subsequent measurement and adjustment of loop gain and loop phase. In one embodiment, adjustments are made to transmitter parameters by causing the attenuator to vary the reference signal, and also by causing a phase adjustment within the feedback correction loop. When training occurs, the control circuitry 327 also interfaces with the keyed AGC system to reset the gain characteristics for the variable gain amplifier 321. The AND-gates 325 are part of the control circuitry which prevent the issuance of a Training Enable signal during the 1.6 millisecond time slot reserved for the training operation, or during the 100 microsecond window during which the AGC system is activated. Without these AND-gates 325, and their connection to the control circuitry, one training operation could generate a request for another training operation in infinite succession. The tandem operation of training and AGC system activation accomplishes at least two desired effects. First, the training operation compensates loop phase and loop gain in response to the antenna load change presented to the power amplifier. Second, the activation of the AGC system resets the detection circuitry in anticipation of future load changes applied to the power amplifier which will require additional compensation.

The circuitry 350 used for the quadrature signal component is similar to the circuitry 310 used for the in-phase signal component. Thus, the reference quadrature signal component 351 is combined with a corresponding feedback signal 352 by a summing junction 356 to provide an error quadrature signal component 353. A threshold generator 355 generates a threshold envelope for use by a window comparator 357 by adding and subtracting a constant from the quadrature component of the reference signal. A variable amplifier 361 scales the error quadrature signal component 353 to produce a scaled error signal 362 which is used as a comparison by the window comparator 357. Preferably, the controller of the variable amplifier 361 is slaved to the control system used in the circuitry 310 for the in-phase single component to reduce circuit complexity. Either of the circuitry 310 for the in-phase signal component or the circuitry 350 for the quadrature signal component may be used to enable training as evidenced by OR-gate 380.

Figure 7:
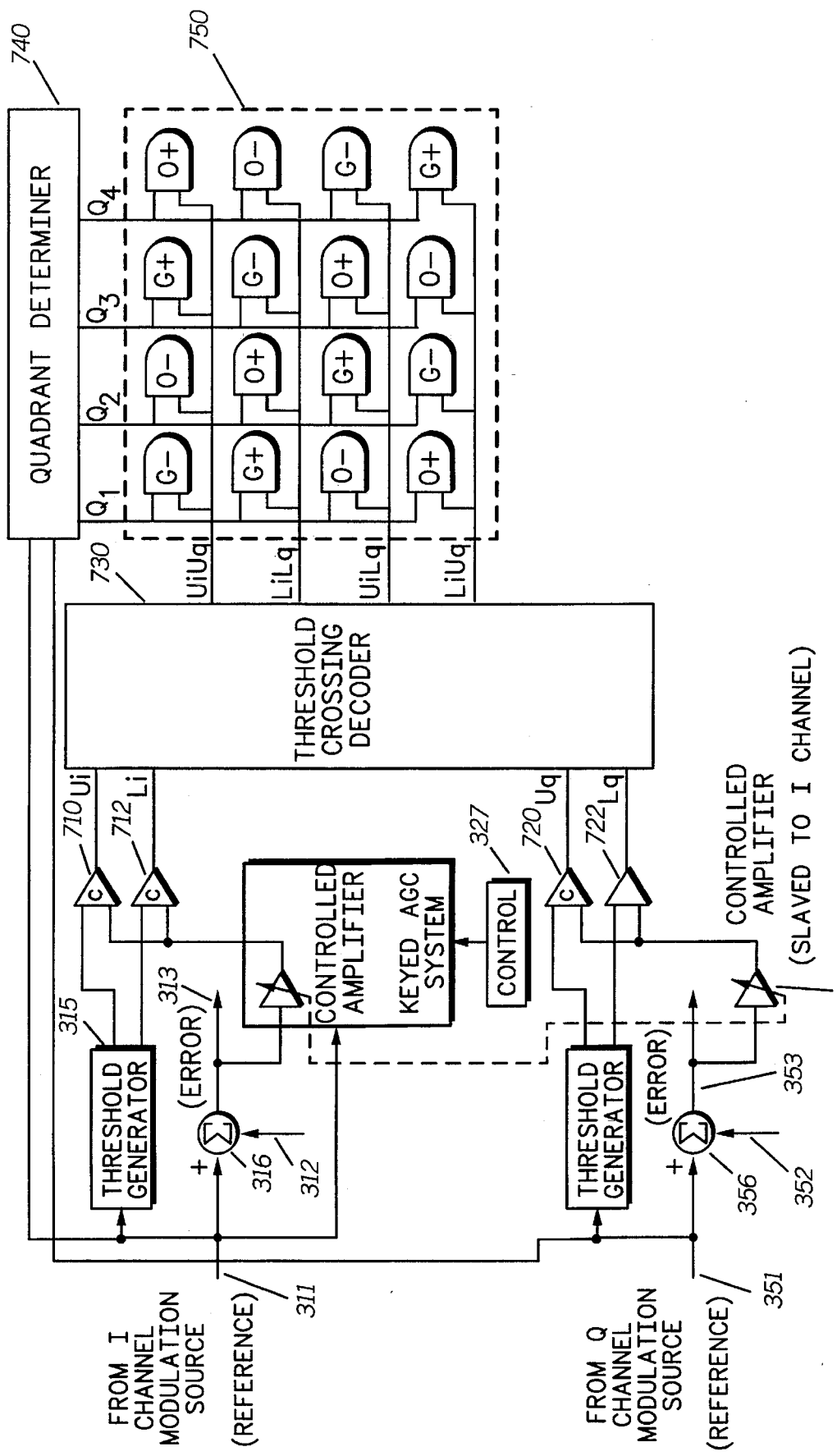
FIG. 7 is an alternative embodiment for implementing detection and adjustment of operating characteristics of the linear transmitter of FIG. 2, in accordance with the present invention.

FIG. 7 shows an alternative embodiment in which direct adjustments are made to increase or reduce loop gain, and to retard or advance loop phase, in order to maintain stable, linear operation without the use of training. This provides increased efficiency in the use of a radio or other communication channel as less time is devoted to training, which conveys no information-bearing data. Further, this method acts to identify and compensate for only that transmitter variable that needs adjustment, in contrast to the blanket measure and adjust technique provided by training. Like reference numerals from FIG. 3 are carried forward and only the differences are discussed with respect to FIG. 7.

The window comparators 317, 357 are shown as separate comparators 710, 712 corresponding to the in-phase signal component, and comparators 720 and 722 corresponding to the quadrature signal component. The in-phase signal component comparator 710, 712 outputs Ui when the in-phase signal component exceeds the upper boundary of the threshold envelope (or upper threshold), and Li when the in-phase signal component exceeds the lower boundary of the threshold envelope (or lower threshold). Similarly, quadrature comparators 720, 722 output signals Uq when the quadrature signal component exceeds the upper boundary of the threshold envelope (or upper threshold), and Lq when the quadrature signal component exceeds the lower boundary of the threshold envelope (or lower threshold). Signals Ui, Li, Uq, and Lq are processed by a threshold crossing decoder 730, which determines threshold characteristics.

The threshold decoder determines that at least one of four (4) threshold characteristics exists when Ui and Uq (UiUq); Li and Lq (LiLq); Ui and Lq (UiLq); or Li and Uq (LiUq) are simultaneously present. Additionally, a quadrant determiner 740, using the in-phase and quadrature signal components of the reference signal, determines whether the reference signal falls into a first quadrant (Q1), a second quadrant (Q2), a third quadrant (Q3), or a fourth quadrant (Q4). Signal lines indicating Q1, Q2, Q3, and Q4 are coupled to threshold characteristic lines UiUq, LiLq, UiLq, and LiUq in a matrix of AND-gates 750. Based on the combination of quadrant and threshold crossing characteristics, a determination is made whether to reduce or increase loop gain and/or whether to retard or advance loop phase.

Figure 8:
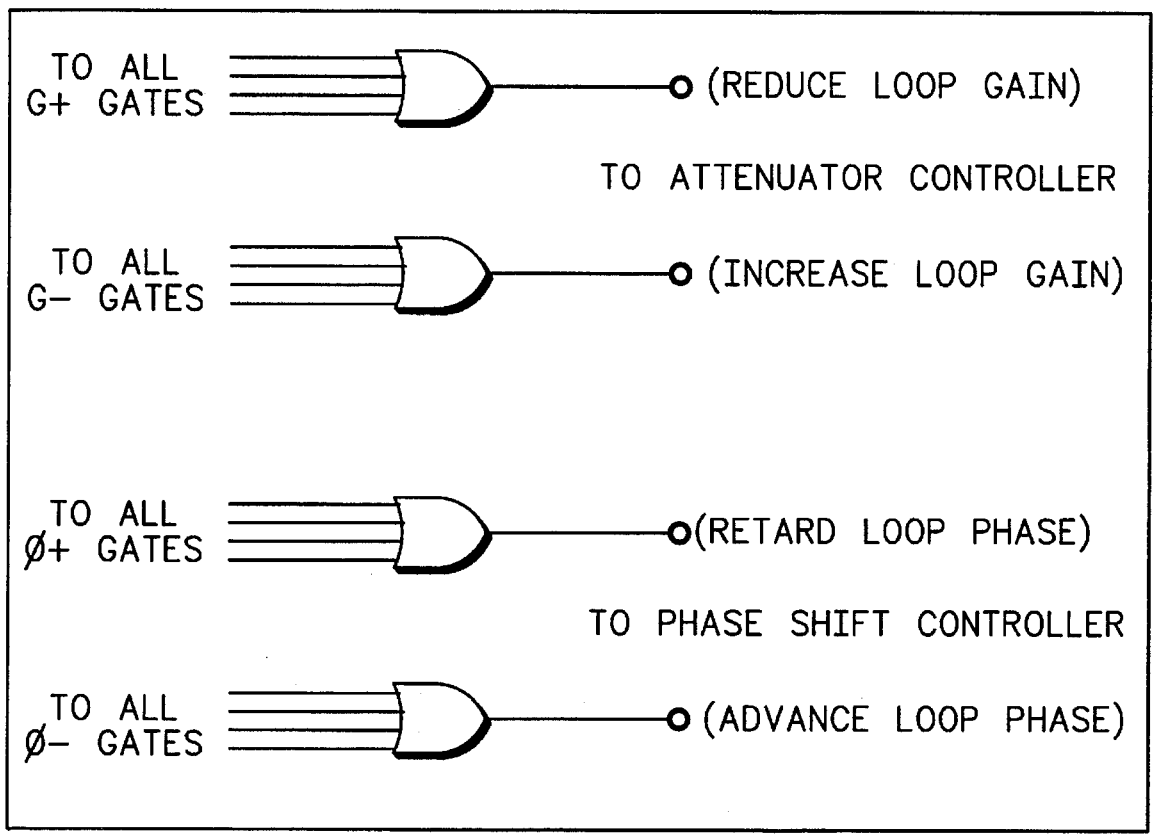
FIG. 8 highlights implementation of corrective actions corresponding to the embodiment of FIG. 7.

FIG. 8 shows the appropriate action for a given combination identified by the AND-gate matrix 750 of FIG. 7. Loop gain is reduced when a first threshold characteristic (UiUq) exists and the reference signal is in the third quadrant (Q3); the second threshold characteristic LiLq exists and the reference signal is in the first quadrant (Q1); the third threshold characteristic (UiLq) exists and the reference signal is in the second quadrant (Q2); or the fourth threshold characteristic (LiUq) exists and the reference signal is in the fourth quadrant (Q4). The loop gain is increased when UiUq exists and the reference signal is in Q1; LiLq exists and the reference signal is in Q3; UiLq exists and the reference signal is in Q4; or LiUq exists and the reference signal is in Q2.

The loop phase is retarded when UiUq exists and the reference signal is in Q4; LiLq exists and the reference signal is in Q2; UiLq exists and the reference signal is in Q3; or LiUq exists and the reference signal is in Q1. The loop phase is advanced when UiUq exists and the reference signal is in Q2; LiLq exists and the reference signal is in Q4; UiLq exists and the reference signal is in Q1; or LiUq exists and the reference signal is in Q3. Preferably, loop gain or reduction is accomplished by varying the attenuator, typically by using an attenuator control. Advancing or retarding the loop phase is accomplished by instructing a phase shift controller to vary the phase within the feedback loop.

By directly controlling the loop gain and the loop phase in response to changes to the error signal, which reflects changes in the transmitter operating environment, rapid adjustments can be made to the linear transmitter in order to maintain a desired stable, linear operation without training. This provides substantial flexibility between the transmission of information while maintaining stability and linearity within the transmitter. Although the preferred embodiment acts to control loop gain using variable attenuators placed between the modulation source and the summing junction, and further controls loop phase in the down conversion path, those skilled in the art will recognize alternative means. For example, loop phase may be controlled by varying the phase of the local oscillator applied to the up converter 224. Loop gain may be alternatively controlled using a variable gain stage placed in the up conversion and/or down conversion paths.

Figure 9:
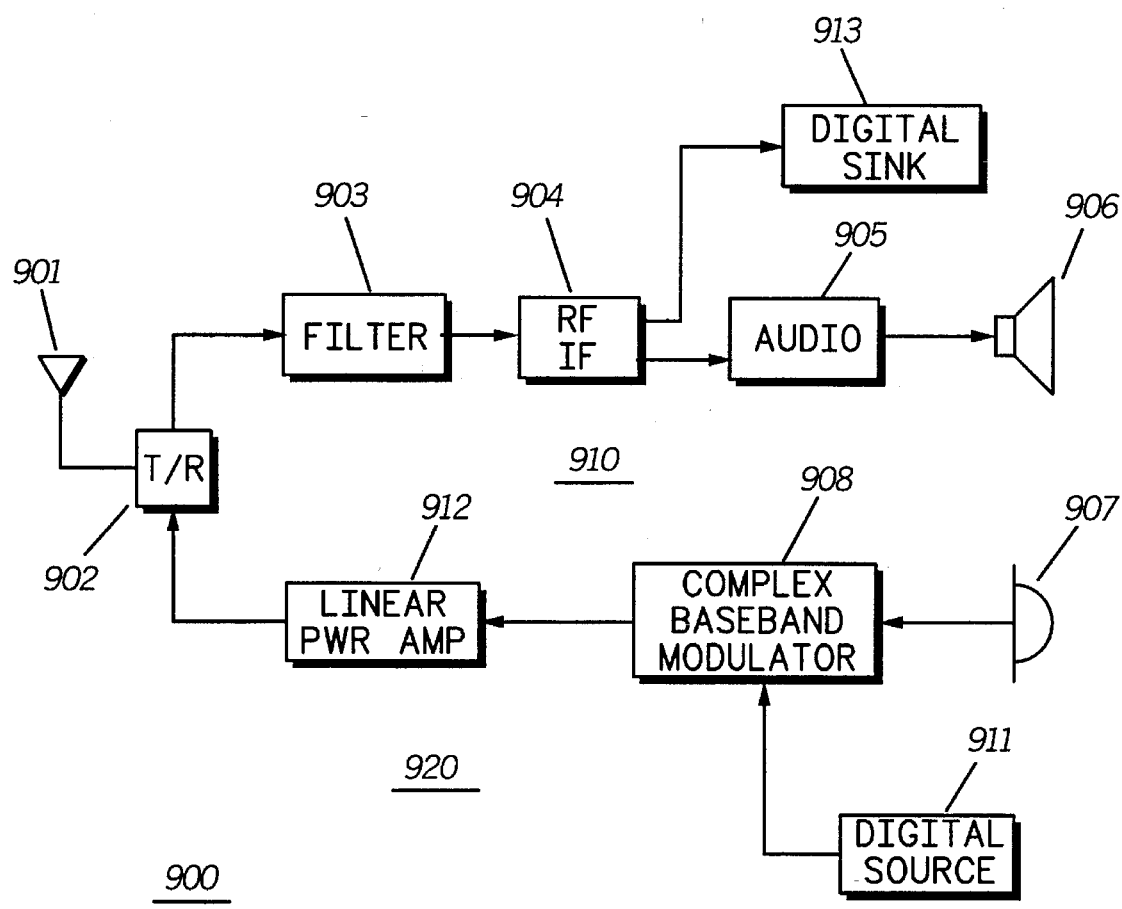
FIG. 9 is a block diagram of a communication device incorporating the linear transmitter of FIG. 2, in accordance with the present invention.

FIG. 9 is a block diagram of a two-way communication device or radio 900 which utilizes a linear transmitter according to the principles of the present invention. The radio 900 includes a receiver section 910 and a transmitter section 920 which allow it to operate in receive and transmit modes. The receiver section 910 and the transmitter section 920 support the transmitting and receiving of communication signals for the radio 900. In the receive mode, the radio 900 receives a communication signal via an antenna 901. A transmit/receive (T/R) switch 902 couples the received communication signal to a filter 903 which provides the desired selectivity for the received communication signal. The output of the filter 903 is applied to a well-known receiver IF section 904 which recovers the baseband signal. The output of the receiver IF section is applied to a well-known audio section 905 or digital sink 913 which, among other things, amplifies audio messages and presents the messages to a speaker 906. In the transmit mode, audio messages are input via a microphone 907 or digital source 911, the output of which is applied to a well-known complex baseband modulator 908 to provide a modulating signal for a linear power amplifier 912. The linear transmitter 912 utilizes the principals of the present invention to process the output of the complex baseband signal modulator 908. The output of the linear transmitter 912 is applied to the antenna 901 through the T/R switch 902 for transmission.

The present invention provides significant advantages over approaches used in the prior art. The linear transmitter does not utilize an isolator, thus avoiding the associated weight, size, and costs. Yet the linear transmitter provides smooth adjustments in response to changing conditions to maintain linearity and stability. Moreover, these adjustments can be made without delay and without imposing significant constraints on transmissions. The result is a linear transmitter capable of rapidly adjusting to changes in operating environment while providing a desirable stable, linear response.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for providing a linear transmitter, comprising the steps of:

providing a transmitter portion having an amplification stage, and a negative feedback correction loop with a feedback signal;

combining a reference signal for amplification and the feedback signal to produce an error signal for coupling to the amplification stage;

determining a difference between the reference signal and the error signal; and varying transmitter parameters when the difference between the reference signal and the error signal exceeds a particular threshold, including the step of generating a training waveform and using the training waveform to adjust gain and phase parameters within the transmitter.

2. The method of claim 1, wherein the step of varying transmitter parameters, comprises the steps of:

providing an attenuator for controlling modulation level of the reference signal; and causing the attenuator to vary the modulation level of the reference signal.

3. The method of claim 1, further comprising the step of comparing the error signal against upper and lower threshold boundaries.

4. The method of claim 1, further comprising the steps of:

placing the transmitter in a preferred state;

coupling the error signal to a keyed automatic gain control system; and using the keyed automatic gain control system to scale the error signal when the transmitter is in the preferred state.

5. The method of claim 4, wherein the step of placing the transmitter in a preferred state comprises the step generating a training waveform to set attenuation and phase adjustment parameters and the step of using the keyed automatic gain control system to scale the error signal comprises the step of determining scaling for the error signal immediately following the adjusting of gain and phase parameters using the training waveform.

6. The method of claim 1, wherein the step of combining a reference signal comprises the step of providing a reference signal having an in-phase signal component and a quadrature signal component.

7. The method of claim 6, further comprising the step of generating upper and lower threshold boundaries for the in-phase signal component and for the quadrature signal component.

8. The method of claim 10, wherein the step of generating upper and lower threshold envelopes comprises the steps of:

adding a first constant to a particular signal component to generate an upper threshold value; and subtracting a second constant from the particular signal component to generate a lower threshold value.

9. A method for operating a transmitter, comprising the steps of:

combining an input signal for amplification with a feedback signal from a negative feedback correction loop of the amplification stage to produce an error signal for coupling to an amplification stage;

generating an upper threshold boundary and a lower threshold boundary for comparisons between the error signal and the input signal; and generating a training waveform to adjust parameters within the transmitter when the error signal is outside the upper threshold boundary or the lower threshold boundary.

10. A method for operating a transmitter, comprising the steps of:

combining an input signal for amplification with a feedback signal from a negative feedback correction loop to produce an error signal for coupling to an amplification stage;

generating an upper threshold boundary and a lower threshold boundary for comparisons between the error signal and the input signal; and adjusting transmitter parameters based on a determination of a quadrant in which the input signal lies and on whether a crossing occurs for a particular threshold boundary.

11. A method for providing a linear transmitter, comprising the steps of:

providing a reference signal having a reference in-phase signal component and a reference quadrature signal component;

combining the reference in-phase signal component and the reference quadrature signal component with corresponding feedback signals from respective feedback loops to produce an error signal having an error in-phase signal component and an error quadrature signal component;

generating first and second threshold envelopes each having an upper boundary and a lower boundary, for the error in-phase signal component and for the error quadrature signal component, respectively, based on the reference signal;

determining a quadrant for the reference signal;

determining threshold crossing characteristics when both the error in-phase signal component and the error quadrature signal component of the error signal are outside the first and second threshold envelopes, respectively; and adjusting parameters for the transmitter based on the quadrant of the reference signal and on the threshold crossing characteristics.

12. The method of claim 11, wherein the step determining a quadrant comprises the step of determining when the reference signal is in a first quadrant, a second quadrant, a third quadrant, or a fourth quadrant.

13. The method of claim 12, wherein the step of determining threshold crossing characteristics comprises the steps of:

determining that a first threshold characteristic exists when the error in-phase signal component exceeds the upper boundary of the first threshold envelope and the error quadrature signal component exceeds the upper boundary of the second threshold envelope;

determining that a second threshold characteristic exists when the error in-phase signal component exceeds the lower boundary of the first threshold envelope and the error quadrature signal component exceeds the lower boundary of the second threshold envelope;

determining that a third threshold characteristic exists when the error in-phase signal component exceeds the upper boundary of the first threshold envelope and the error quadrature signal component exceeds the lower boundary of the second threshold envelope; and determining that a fourth threshold characteristic exists when the error in-phase signal component exceeds the lower boundary of the first threshold envelope and the error quadrature signal component exceeds the upper boundary of the second threshold envelope.

14. The method of claim 13, wherein the step of adjusting parameters for the transmitter comprises the steps of:

reducing gain for a feedback loop when there exists one of:

the first threshold characteristic exists and the reference signal is in the third quadrant;

the second threshold characteristic exists and the reference signal is in the first quadrant;

the third threshold characteristic exists and the reference signal is in the second quadrant; and the fourth threshold characteristic exists and when the reference signal is in the fourth quadrant;

increasing gain for a feedback loop when there exists one of:

the first threshold characteristic exists and the reference signal is in the first quadrant;

the second threshold characteristic exists and the reference signal is in the third quadrant;

the third threshold characteristic exists and the reference signal is in the fourth quadrant; and the fourth threshold characteristic exists and when the reference signal is in the second quadrant.

15. The method of claim 14, wherein the step of reducing gain and the step of increasing gain comprise the step of instructing an attenuator to adjust modulation level of the reference signal.

16. The method of claim 13, wherein the step of adjusting parameters for the transmitter comprises the steps of:

retarding phase of a feedback loop when there exists one of:

the first threshold characteristic exists and the reference signal is in the fourth quadrant;

the second threshold characteristic exists and the reference signal is in the second quadrant;

the third threshold characteristic exists and the reference signal is in the third quadrant; and the fourth threshold characteristic exists and when the reference signal is in the first quadrant;

advancing phase of a feedback loop when there exists one of:

the first threshold characteristic exists and the reference signal is in the second quadrant;

the second threshold characteristic exists and the reference signal is in the fourth quadrant;

the third threshold characteristic exists and the reference signal is in the first quadrant; and the fourth threshold characteristic exists and when the reference signal is in the third quadrant.

17. The method of claim 11, wherein the step of generating first and second threshold envelopes comprises the steps of:

adding a first constant to a particular signal component to generate an upper threshold value; and subtracting a second constant from the particular signal component to generate a lower threshold value.

18. A linear transmitter apparatus having variable transmitter parameters, comprising:

an attenuator coupled to a modulation source and a reference signal for amplification as an output;

a negative feedback correction loop having a feedback signal;

a summing junction coupled to the reference signal and the feedback signal and summing the reference signal and the feedback signal to provide an error signal;

an amplification stage coupled to the error signal;

a keyed automatic gain control system coupled to the reference signal and to the error signal and having an output of a scaled error signal;

a comparator coupled to the reference signal and to the scaled error signal and having a particular output signal when a difference between the reference signal and the scaled error signal exceeds a threshold; and a controller responsive to the particular output signal to vary the transmitter parameters;

wherein the keyed automatic gain control system is responsive to a training waveform triggered in response to the particular output signal to adjust the scaled error signal.

19. The linear transmitter apparatus of claim 18, wherein the controller comprises an attenuator controller coupled to the attenuator.

20. The linear transmitter apparatus of claim 18, wherein the controller comprises a phase shift adjuster coupled to the feedback signal.

21. The linear transmitter apparatus of claim 18, further comprising:

a threshold generator coupled to the reference signal and to the comparator; and a variable gain amplifier coupled between the error signal and the comparator.

22. A linear transmitter apparatus having variable transmitter parameters, comprising:

a modulation source providing an input signal for amplification comprising a first signal component and a second signal component;

first and second circuitry portions coupled to the first signal component and the second signal component, respectively, each circuitry portion comprising:

an amplification stage having a negative feedback correction loop that provides a feedback signal;

a summing junction coupled to the respective signal component and to the feedback signal, and providing an error signal as input to the amplification stage;

a threshold generator that generates a threshold envelope having an upper boundary and a lower boundary for the error signal;

a threshold crossing decoder coupled to the first and second circuitry portions, the threshold crossing decoder providing threshold crossing characteristics when the error signals for the first and second circuitry portions are simultaneously outside the first and second threshold envelopes, respectively;

a quadrant determiner coupled to the first and second circuitry portions, the quadrant determiner having an output based on a quadrant that characterizes the input signal;

adjustment apparatus coupled to the first and second circuitry portions and operable to initiate an adjustment to a particular based on a combination of the threshold crossing characteristics and the quadrant of the input signal.

23. The linear transmitter apparatus of claim 22, wherein first signal component is an in-phase signal component and the second signal component is a quadrature signal component.

24. The linear transmitter apparatus of claim 22, wherein the adjustment apparatus comprises an attenuator controller coupled to the input signal.

25. The linear transmitter apparatus of claim 22, wherein the adjustment apparatus comprises a phase shift adjuster coupled to the feedback signal.

26. A communication device, comprising:

an antenna;

a modulation source providing an input signal comprising a first signal component and a second signal component;

a transmitter coupled between the modulation source and the antenna, the transmitter comprising:

first and second circuitry portions coupled to the first signal component and the second signal component, respectively, each circuitry portion comprising:

an amplification stage having a negative feedback correction loop that provides a feedback signal;

a summing junction coupled to the respective signal component and to the feedback signal, and providing an error signal as input to the amplification stage;

a threshold generator that generates a threshold envelope having an upper boundary and a lower boundary for the error signal;

a threshold crossing decoder coupled to the first and second circuitry portions, the threshold crossing decoder providing threshold crossing characteristics when the error signals for the first and second circuitry portions are simultaneously outside the first and second threshold envelopes, respectively;

a quadrant determiner coupled to the first and second circuitry portions, the quadrant determiner having an output based on a quadrant that characterizes the input signal;

adjustment apparatus coupled to the first and second circuitry portions and operable to initiate an adjustment to a particular based on a combination of the threshold crossing characteristics and the quadrant of the input signal;

wherein the communication device has no isolators between the modulation source and the antenna.

\* \* \* \* \*